(12) United States Patent
Otremba

(10) Patent No.: US 7,745,929 B2
(45) Date of Patent: Jun. 29, 2010

(54) SEMICONDUCTOR DEVICE AND METHOD FOR PRODUCING THE SAME

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 633 days.

(21) Appl. No.: 11/565,189

(22) Filed: Nov. 30, 2006

(65) Prior Publication Data
US 2007/0145573 A1 Jun. 28, 2007

(30) Foreign Application Priority Data
Nov. 30, 2005 (DE) .................. 10 2005 057 401

(51) Int. Cl.
*H01L 23/34* (2006.01)
(52) U.S. Cl. .............................. 257/718; 257/E23.034; 257/E23.044
(58) Field of Classification Search ................. 257/713, 257/E23.034, E23.044
See application file for complete search history.

(56) References Cited

U.S. PATENT DOCUMENTS

| 6,465,276 B2 | 10/2002 | Kuo | 438/110 |
| 6,630,726 B1 | 10/2003 | Crowley et al. | 157/666 |
| 2004/0080028 A1 | 4/2004 | Yanagisawa | 257/675 |
| 2007/0278664 A1* | 12/2007 | Carney et al. | 257/706 |

FOREIGN PATENT DOCUMENTS

DE 102004021838 A1 9/2005

OTHER PUBLICATIONS

Sawle et al. "DirectFET™-A Proprietary New Source Mounted Power Package for Board Mounted Power" (1 page).
"HPA TrenchMOS™ in LFPAK" Phillips (1 page).
Sawle et al. "Novel Power MOSFET Packaging Technology Doubles Power Density in Synchronous Buck Converters for Next Generation Microprocessors" IEEE (1 page), 2002.
German Office Action for German Patent Application No. 10 2005 057 401.7 (4 pages), Sep. 5, 2006.

* cited by examiner

*Primary Examiner*—Sue Purvis
*Assistant Examiner*—Krista Soderholm
(74) *Attorney, Agent, or Firm*—Banner & Witcoff, Ltd.

(57) ABSTRACT

A semiconductor device (1) has a semiconductor component (2), a first electrode (6) and a control electrode (7) being arranged on the top side (4). The semiconductor device (1) furthermore has a circuit carrier (3) having a chip island (9) and a plurality of flat conductors (10). The rear side (5) of the semiconductor component (2) is mounted on the chip island (9). The first electrode (6) is electrically connected to a first flat conductor (13) via a first contact clip (16) and the control electrode (7) is electrically connected to a control flat conductor (14) via the second contact clip (19). The upper surface (33) of the first contact clip (16) is at least partly arranged in a plane which is further away from the top side (4) of the semiconductor component (2) than the entire upper surface (34) of the second contact clip (19).

25 Claims, 2 Drawing Sheets

SEMICONDUCTOR DEVICE AND METHOD FOR PRODUCING THE SAME

RELATED APPLICATION

This application claims priority from German Patent Application No. DE 10 2005 057 401.7, which was filed on Nov. 30, 2005, and is incorporated herein by reference in its entirety.

TECHNICAL FIELD

The invention relates to a semiconductor device, in particular a power semiconductor device, and a method for producing the same.

BACKGROUND

Owing to the growing demand for increased chip power, inadequate heat dissipation is a growing problem in semiconductor devices, particularly in semiconductor devices having power semiconductor components. Said inadequate heat dissipation can lead to instability and to a failure of the semiconductor component. It is generally known that an additional heat sink can be arranged on the device housing or directly on the semiconductor component in order to distribute the heat better.

However, it is more complicated to mount a heat sink onto vertical power devices since the top side and also the underside of the semiconductor component have a contact connection. Consequently, contact elements are arranged on the top side and also on the underside of the semiconductor component, with the result that the semiconductor component is left with no or very little free surface area onto which an additional heat sink can be mounted.

DE 10 2004 021 838 discloses a semiconductor device having a single contact clip, which is in thermal contact with the surroundings in order to improve the heat dissipation from the device. However, this device has the disadvantage that the arrangement is not suitable for devices having a plurality of contact elements on the top side of the semiconductor component, for example for vertical power semiconductor components, since short circuits can arise between the heat sink and the plurality of contact elements.

SUMMARY

In an embodiment, a semiconductor device may comprise a semiconductor component having a top side and a rear side, at least one first electrode and at least one control electrode being arranged on the top side and a second electrode being arranged on the rear side, a circuit carrier having a chip island and a plurality of flat conductors, the rear side of the semiconductor component being mounted on the chip island, at least one first contact clip having a first contact region and a second contact region, and the first electrode being electrically connected to a first flat conductor via the first contact clip, at least one second contact clip having a first contact region and a second contact region, and the control electrode being electrically connected to a control flat conductor via the second contact clip, and wherein the upper surface of the first contact clip is at least partly arranged in a plane which is further away from the top side of the semiconductor component than the entire upper surface of the second contact clip.

BRIEF DESCRIPTION OF THE DRAWINGS

The invention will now be explained in more detail with reference to the figures.

FIG. 1 shows a plan view of a semiconductor device 1 according to an embodiment, said semiconductor device having a semiconductor component 2 and a circuit carrier 3.

DETAILED DESCRIPTION

Figure 1:
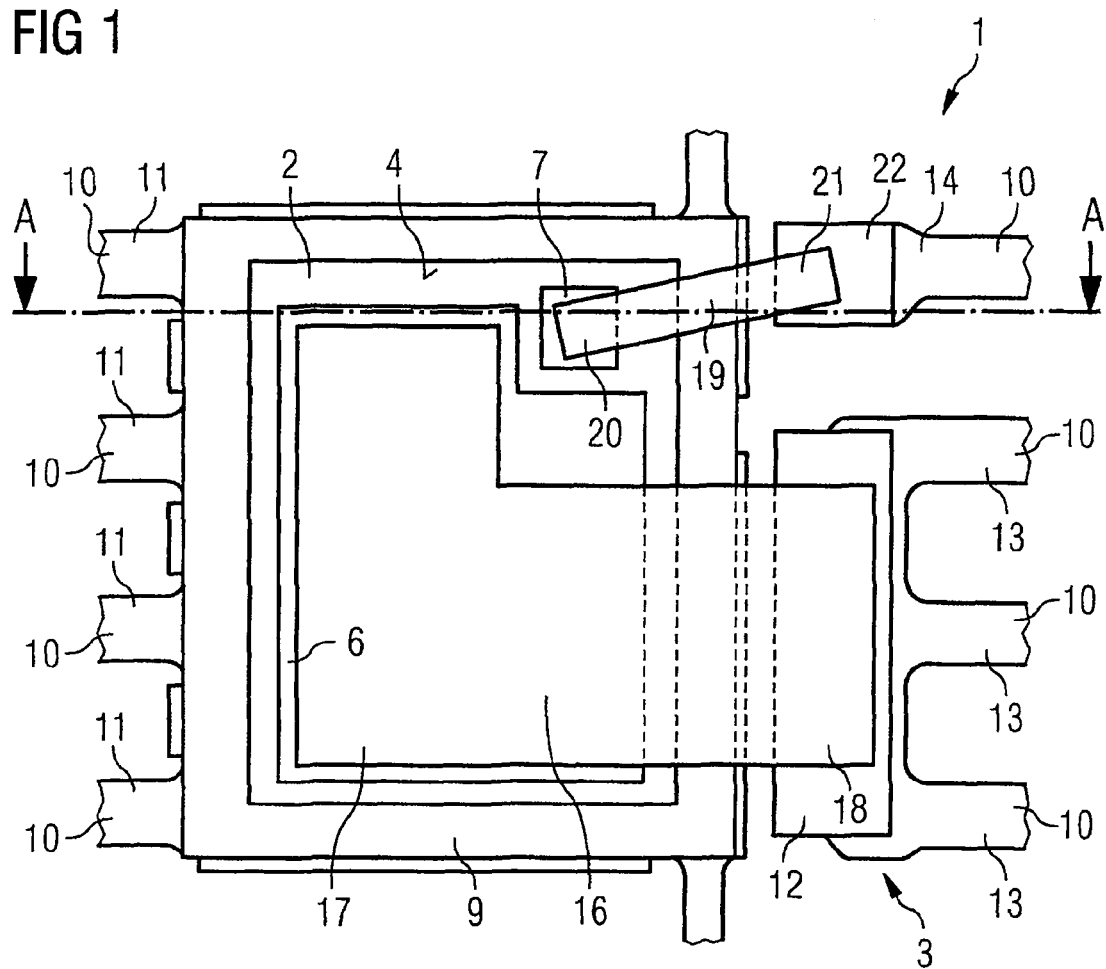
FIG. 1 shows a plan view of a semiconductor device.

According to an embodiment, a semiconductor device has a semiconductor component having a top side and a rear side. At least one first electrode and at least one control electrode are arranged on the top side of the semiconductor element and a second electrode is arranged on the rear side of the semiconductor component. The semiconductor device furthermore has a circuit carrier having a chip island and a plurality of flat conductors. The rear side of the semiconductor component is mounted on the chip island of the leadframe.

According to an embodiment, the semiconductor device also has at least one first contact clip having a first contact region and a second contact region, and at least one second contact clip having a first contact region and a second contact region. The first electrode is electrically connected to a first flat conductor via the first contact clip and the control electrode is electrically connected to a control flat conductor via the second contact clip. The upper surface of the first contact clip is at least partly arranged in a plane which is further away from the top side of the semiconductor component than the entire upper surface of the second contact clip.

According to an embodiment, the upper surfaces of the first and second contact clips are arranged in such a way that at least one part or one region of the upper surface of the first contact clip is arranged in a higher plane with regard to the semiconductor component and the circuit carrier than the entire upper surface of the second contact clip. The entire upper surface of the second contact clip is thus arranged in a lower plane than said region. Consequently, an additional heat sink can be mounted more simply on the higher region of the first contact clip without touching the second contact clip or being in direct contact with the second contact clip. That region of the upper surface of the first contact clip which is arranged further away from the top side of the semiconductor component than the entire upper top side of the second contact clip thus provides a cooling linking area or heat sink attachment area or connection area for an additional heat sink.

According to an embodiment The region of the upper surface specifying the cooling linking can be advantageously essentially flat. This simplifies the mounting of the heat sink on the device. According to an embodiment, the cooling linking area can be advantageously as large as possible and may form the majority of the upper top side of the semiconductor device. This enables a larger heat sink to be mounted on the device, with the result that the heat dissipation is improved further.

According to an embodiment, the semiconductor component may have a first electrode, which may be a power electrode, and a control electrode on its top side. In this embodiment, the semiconductor device has a first contact clip and a second contact clip.

In a further embodiment, two or more control electrodes and a power electrode are arranged on the top side of the semiconductor component. In this case, the semiconductor device has a first contact clip and a number of control contact clips corresponding to the number of control electrodes. In a further embodiment, two or more first electrodes are provided on the top side of the semiconductor component. In this case, the semiconductor device has a number of first contact clips corresponding to the number of first electrodes.

Since the entire upper surface of the second contact clip is in a plane below the linking or heat sink attachment area, the additional heat sink may extend over and above the second contact clip without coming into contact with the second contact clip. Thus, according to an embodiment, the cooling area of the device may be increased without affecting the functionality of the device due to an electrical connection between the additional heat sink, which is typically metallic, and the second contact clip which is electrically connected to the control electrode of the semiconductor component.

According to an embodiment, the arrangement of the two types of contact clips has the advantage that the risk of short circuits between an additional mounted heat sink and the second contact clip is avoided. Furthermore, the mounting of an additional heat sink on the finished semiconductor device is simplified for the customer since it is possible to dispense with additional electrical insulation between the heat sink and the second contact clip.

According to an embodiment, the semiconductor device may furthermore have a plastic housing composition. The upper surface of the first contact clip is at least partly free of the plastic housing composition. According to an embodiment, the upper surface of the second contact clip is encapsulated by the plastic housing composition. According to an embodiment, the region of the upper surface of the first contact clip which is free of the plastic housing composition is advantageously the region which is further away from the top side of the semiconductor component than the entire surface of the second contact clip. The cooling linking area of the semiconductor device is thus free of the plastic housing composition. This embodiment has the advantage that the plastic housing composition provides a non-electrically-conductive insulation between the second contact clip and the first contact clip. Furthermore, according to an embodiment, the plastic housing composition provides an electrical insulation between the second contact clip and the cooling linking area for the heat sink. This further simplifies the mounting of a heat sink on the semiconductor device.

In a further embodiment, the first contact region of the first contact clip is arranged on the first electrode and the first contact region of the second contact clip is arranged on the control electrode. According to an embodiment, the height c of the first contact region of the first contact clip is greater than the height d of the first contact region of the second contact clip. In this context, the height c of the first contact region of the first contact clip is the height of the upper surface of said contact region from the top side of the semiconductor component. According to an embodiment, the height d of the first contact region of the second contact clip is the height of the upper surface of said contact region from the top side of the semiconductor component. Consequently, at least one part of the upper surface of the first contact region of the first contact clip is arranged in a plane which is further away from the top side of the semiconductor component than the entire surface of the second contact clip.

This arrangement of the first and second contact clips has the advantage that a cooling linking area is specified on account of the height difference. According to an embodiment, after the semiconductor component has been electrically contact-connected to the circuit carrier, a region of the upper surface of the first contact clip is arranged in a plane which is arranged further away than the entire upper surface of the second contact clip. No further method steps or modifications of the components of the semiconductor device are necessary. The heat dissipation of the semiconductor device can thus be improved cost-effectively by an appropriate selection of the form and arrangement of the two contact clips.

According to an embodiment, the heights c and d of the first contact region of the first and second contact clips may be set through the form of the contact clip. By way of example, it is possible to set the length of the legs of a U-shaped contact clip. According to an embodiment, the first contact clip thus has longer legs than the second contact clip.

According to an embodiment, the thickness or material thickness of the first contact clip and of the second contact clip may be selected such that, after the mounting of the semiconductor device, the upper surface at least one part of the first contact clip is arranged in a plane higher than the entire upper surface of the second contact clip. In this context, higher is used to denote the distance between the upper surface of the first contact clip and the top side of the semiconductor component. According to an embodiment, the upper surface of this part of the first contact clip, therefore, lies in a plane which is positioned at a greater distance from the top side of the semiconductor component as the entire upper side of the second contact clip. The first contact clip thus has a larger thickness than the second contact clip.

According to an embodiment, the arrangement of the upper surface of the first and second contact clips may also be provided by a combination of the material thickness and form of the first and second contact clips.

In a further embodiment, the thickness a of the first contact region and the thickness b of the second contact region of the first contact clip are approximately identical. This simplifies the production of the contact clip since less processing is required in order to produce the contact clip. If, for example, the contact clips are U-shaped, the length of the legs of the U may be adjusted relatively. In other words the first contact clip is provided with longer legs than the second contact clip so that the upper surface of the first contact clip lies in a plane above the entire second surface of the first contact clip when the two contact clips are mounted in the device. According to an embodiment, the difference in the length of the legs of the first and second contact clip are adjusted relative to each other. In an embodiment, the contact clip may be approximately S-shaped.

According to an embodiment, the thickness of the first contact region and the thickness of the second contact region of the second contact clip may also be approximately identical. According to an embodiment, the thickness of the entire second contact clip may be less than the thickness of the first contact region of the first contact clip.

In a further embodiment, the thickness of the entire first contact clip is greater than the thickness of the entire second contact clip. The first contact clip thus has a larger material thickness than the second contact clip.

According to an embodiment, the first and second contact clips may comprise a foil such as a metal foil which has a thickness. According to an embodiment, the thickness of the foil of the first contact clip is greater than the thickness of the second contact clip. According to an embodiment, the first and second contact clips may be formed from a foil of the desired thickness by stamping the lateral shape and by plastically deforming the upper and/or lower surfaces of the foil to produce the desired longitudinal form of the contact clip. In this way, a contact clip may be formed which comprises a first leg portion and a second leg portion which are connected by a plate portion. According to an embodiment, the first and second leg portions protrude from the lower side of the foil. According to an embodiment, a general U-form may, therefore, be produced by pressing the foil. According to an embodiment, the lower surfaces of the first and second leg portions each provide a contact area or contact pad which is adapted to be positioned in direct contact with the electrode on the top side of the semiconductor component and the flat conductor of the circuit carrier, respectively.

According to an embodiment, a plurality of contact clips of a particular type may be produced from a single foil or plate. According to an embodiment, the stamping and plastically deforming processes may be carried out during the same action. Consequently, the production method is more efficient and more cost effective.

According to an embodiment, a plurality of contact clips may be provided in the form of a carrier foil in which the plurality of contact clips are held in the form of a carrier foil by joining bars which can be severed just before the contact clip is mounted on the semiconductor component. According to an embodiment, these joining bars may be narrow and can additionally have a predetermined breaking point so that only a small force is required to remove them from the carrier foil. In other words, the carrier foil comprises a plurality of partially severed pre-formed contact clips. According to an embodiment, a plurality of contact clips may be more simply transported and more simply orientated during the device assembly process.

According to an embodiment, the carrier foil has a thickness selected to produced a particular contact clip. According to an embodiment, the thickness of the carrier foil for a first contact clip is greater than the thickness of a foil for a second contact clip. According to an embodiment, the difference in the thickness of the two foils is selected with respect to one another so as to provide two contact clips which fulfill the requirements of the semiconductor device, when mounted in the semiconductor device, as previously described.

According to an embodiment, the difference in the position of the upper surface of the first and second contacts clips of the semiconductor device can be simply produced by providing contacts clips in the form of a plastically deformed foil, each having one of two different general thicknesses. More precisely, the general thickness of the foil of the load contact clip is greater than the general thickness of the foil of the control contact clip. This has the advantage that the current carrying capacity of the first contact clip is increased as the cross-sectional area is increased due to the increased thickness of the foil. According to an embodiment, in contrast, the cross-sectional area of the control contact clip is smaller than that of the first contact clip which decreases materials costs without detracting from device performance.

According to an embodiment, the height difference between the two different contact clips may also be increased or adjusted by the degree of plastic deformation applied to the foil.

In one embodiment, the lower side of the chip island and the lower sides of the flat conductors are free of the plastic housing composition. The lower side of the chip island and the lower sides of the flat conductors thus provide external contact areas of the semiconductor device.

According to an embodiment, the first contact clip may be electrically connected to the first electrode and/or the first flat conductor by means of soft solder or diffusion solder or an electrically conductive adhesive.

According to an embodiment, similarly, the second contact clip may be electrically connected to the control electrode and/or to the control flat conductor by means of soft solder or diffusion solder or an electrically conductive adhesive.

In one embodiment, the semiconductor component is a vertical power semiconductor component, for example a vertical power transistor. The first electrode and the second electrode are thus power electrodes. The vertical power semiconductor component may be a MOSFET (Metal Oxide Semiconductor Field Effect Transistor), an IGBT (Isolated Gate Bipolar Transistor) or a BJT (Bipolar Junction Transistor). The vertical power semiconductor component may be an n-channel MOSFET or a p-channel MOSFET.

According to an embodiment, in the case of a MOSFET power semiconductor component, the first electrode is a source electrode, the control electrode is a gate electrode and the second electrode is a drain electrode. According to an embodiment, in the case of an IGBT power semiconductor component, the first electrode is an emitter electrode, the control electrode is a gate electrode and the second electrode is a collector electrode. According to an embodiment, in the case of a BJT power semiconductor component, the first electrode is an emitter electrode, the control electrode is a base electrode and the second electrode is a collector electrode.

According to an embodiment, the semiconductor device may have a known housing. In particular, it may have a known number and arrangement of the external contact connections and/or a known area and/or specific dimensions. This simplifies the mounting of the semiconductor device on a superordinate printed circuit board and enables the use of the semiconductor device according to an embodiment with improved heat dissipation in existing systems or on existing printed circuit boards without the system or the printed circuit board having to be changed. According to an embodiment, the housing may be embodied as an SO housing, for example an SO8 housing, power SO housing, a powerQFN (Quad Flat Non-Leaded package), a VQFN (Very thin profile Quad Flat Non-Leaded package), a DIP8 or TO housing, for example a TO252, TO3 or TO220 housing.

In another embodiment, a method for producing a semiconductor device, may have the following steps. A semiconductor component having a top side and a rear side is provided. At least one first electrode and at least one control electrode are arranged on the top side of the semiconductor component and a second electrode is arranged on the rear side of the semiconductor component. A circuit carrier having a chip island and a plurality of flat conductors is provided and the rear side of the semiconductor component is mounted on the chip island.

At least one first contact clip having a first contact region and a second contact region and at least one second contact clip having a first contact region and a second contact region are provided. An electrical connection is produced between the first electrode and a first flat conductor by way of the first contact clip and an electrical connection is produced between the control electrode and the control flat conductor by way of the second contact clip. The first contact clip and the second contact clip are arranged such that the upper surface of the first contact clip is at least partly arranged on a plane which is further away from the top side of the semiconductor component than the upper surface of the second contact clip.

The arrangement according to an embodiment of the upper surface of the first and second contact clips may be carried out in various ways in order to arrange a region of the first contact clip such that it is arranged in a plane which is further away from the top side of the semiconductor component than the entire surface of the second contact clip.

The arrangement according to an embodiment may be realized by an appropriate selection of the size of the first and second contact clips. By way of example, in an embodiment, a first contact clip having a thickness greater than the thickness of the second contact clip may be provided. Once the undersides of the first and second contact clips have been mounted on the top side of the semiconductor device, the upper surface of the first contact clip is arranged in a plane which is higher than the entire upper surface of the second contact clip.

According to an embodiment, the form of the first and second contact clips can be set such that the upper surface of the first contact clip is at least partly arranged on a plane which is further away from the top side of the semiconductor component than the upper surface of the second contact clip. If one or both of the contact clips have a U-shaped cross section, the height of the sidewalls can be set such that the bottom of the U-shape is arranged in a different plane. According to an embodiment, the sidewalls of the first contact clip may be larger than the sidewalls of the second contact clip. After the contact clips have been mounted on the top side of the semiconductor component, the underside of the bottom of the U-shape provides the upper top side of the contact clip. The underside of the bottom of the first contact clip thus provides the cooling linking area.

The method according to an embodiment may have a further additional step, in which the semiconductor component is embedded into a plastic housing composition. This is carried out in such a way that the upper surface of the first contact clip is at least partly free of the plastic housing composition, and the entire upper surface of the second contact clip is encapsulated by the plastic housing composition. The semiconductor device thus has a top side in which a cooling linking area is free of the plastic composition. Said cooling linking area thus forms a part of the outer surface of the device housing. By contrast, the second contact clip is embedded in the plastic housing composition.

In a further form of implementation, the semiconductor component and the circuit carrier are embedded into the plastic composition in such a way that the lower side of the chip island and the lower sides of the flat conductors are free of the plastic housing composition. The uncovered sides of the chip island and of the flat conductors thus provide the external contact connections of the semiconductor device.

In one form of implementation, the first contact clip having a height c of its first contact region and the second contact clip having a height d of its contact region are provided. The height of the first contact region of the first contact clip is greater than the height of the first contact region of the second contact clip. The first contact region of the first contact clip is arranged on the first electrode and the first contact region of the second contact clip is arranged on the control electrode. This method provides an arrangement where the top side of the first region of the first contact clip is arranged in a plane which is further away from the top side of the semiconductor component than the entire surface of the second contact clip.

In a further form of implementation, the thickness of the first contact region and the thickness of the second contact region of the second contact clip are set to be approximately identical. The height of the first and second contact clip may be selected so that the upper surface of a portion of the first contact clip lies in a plane higher, that is at a greater distance from the top side of the semiconductor component, than the entire upper surface of the second contact clip.

In a further embodiment, the height of the first contact region of the first contact clip is greater than the height of the first contact region of the second contact clip. The thickness of the first contact clip and of the second contact clip may be different. After the contact clips have been mounted on the semiconductor component and the circuit carrier, this dimensional arrangement leads to an arrangement according to an embodiment of the upper surface of the first and second contact clips.

According to an embodiment, the first contact clip may be electrically connected to the first electrode and/or to the first flat conductor by means of soft solder or diffusion solder or an electrically conductive adhesive. According to an embodiment, the second contact clip may be electrically connected to the control electrode and/or to the control flat conductor by means of soft solder or diffusion solder or an electrically conductive adhesive.

According to an embodiment, a contact clip may be produced by providing a foil of a desired thickness and stamping and/or pressing the contact clip with the desired form from the foil. According to an embodiment, the foil may comprise a metal or a an alloy such as copper. According to an embodiment, a plurality of contact clips of a desired type may be produced from the same foil.

According to an embodiment, the stamped contact clip may have the form of a strip. According to an embodiment, the lateral from may be generally rectangular or may be L-shaped for example. According to an embodiment, the ends of the strip may be bent towards one side of the strip to provide a U-form. According to an embodiment, the legs of the U-form proving contact regions. According to an embodiment, alternatively, one side of the strip may be depressed to produce depressions on one side and corresponding protrusions on the opposing side of the strip. According to an embodiment, the lower surface of the protrusions provide contact areas.

In a further embodiment, a plurality of contact clips are provided in the form of a carrier foil. The plurality of contact clips, each having the desired form, are partially severed from the foil and held mechanically in the foil by joining bars. To produce a semiconductor device comprising a first contact clip of a first general thickness and a second contact clip of a second general thickness, which is smaller than the first general thickness of the first contact clip, two foils are provided, the first oil having the first general thickness and the second foil having the second general thickness.

According to different embodiments, a semiconductor device is provided having two contact clips having different material thicknesses for making contact with the electrodes on the top side of the semiconductor component. The source electrode can be utilized as cooling linking without short-circuiting the gate contact clip on the housing top side. This means that insulation of the housing top side on the part of the customer prior to heat sink mounting is no longer necessary. The arrangement according to an embodiment is advantageous in the case of n-channel MOSFETs on account of the grounding of the source contact for n-channel MOSFETs in half-bridges.

According to an embodiment, the semiconductor component 2 is a vertical power MOSFET having a top side 4 and a rear side 5. A source electrode 6 and a gate electrode 7 are arranged on the top side 4 of the semiconductor component 2. The gate electrode 7 is arranged in a corner of the top side 4 and the source electrode 6 has an area corresponding to the remaining area of the top side. A drain electrode 8 is arranged on the rear side 5 of the semiconductor component 2.

The circuit carrier 3 has a chip island 9 and eight flat conductors 10. Four flat conductors 10 are arranged in each case on two opposite sides of the chip island 9. On one side of the chip island 9, the four flat conductors 10 project from the chip island 9 and provide four drain flat conductors 11. On the opposite side of the chip island 9, the four flat conductors 10 are arranged alongside the chip island 9 and are not in direct contact with the chip island 9. Three adjacent flat conductors 10 are connected to a contact area 12 arranged between the inner ends of the three flat conductors 10. The outer regions of the three flat conductors 10 provide the source flat conductors 13. The further flat conductor 10 is arranged alongside the gate electrode 7 and provides the gate flat conductors 14. The inner end of the gate flat conductors which is arranged alongside the chip and provides a contact area.

The rear side 5 of the semiconductor component 2 is mounted on the chip island 9 and is electrically connected to the chip island 9 and the four drain flat conductors 11 via a diffusion solder connection 15. This arrangement can be seen in FIG. 2.

The source electrode 6 is electrically connected to the contact area 12 of the source flat conductors 13 via a source contact clip 16. The source contact clip 16 has a first contact region 17 mounted on the source electrode by means of diffusion solder 36. A second contact region 18 of the source contact clip 16 is mounted on the contact area 12 of the source flat conductors 13 by means of diffusion solder 36. The source contact clip 16 is L-shaped. The form and size of the first contact region 17 corresponds to the form and size of the source electrode 6 and the form and size of the second region 18 corresponds to the form and size of the source contact area 12. The boundary between the first contact region 17 of the source contact clip 16 and the source electrode 6 and between the second contact region 18 of the source contact clip 16 and the source contact area 12 is thereby increased. The electrical resistance of the boundaries and the associated losses are thus reduced.

The gate electrode 7 is electrically connected to the gate flat conductor 14 via a second contact clip 19. The gate contact clip 19 has a first contact region 20 mounted on the gate electrode 7 by means of diffusion solder 36 and a second contact region 21 mounted on the contact area 22 of the gate flat conductors 14 by means of diffusion solder 36. The semiconductor device 1 also has a plastic housing composition 23 (not shown in FIG. 1).

Figure 2:
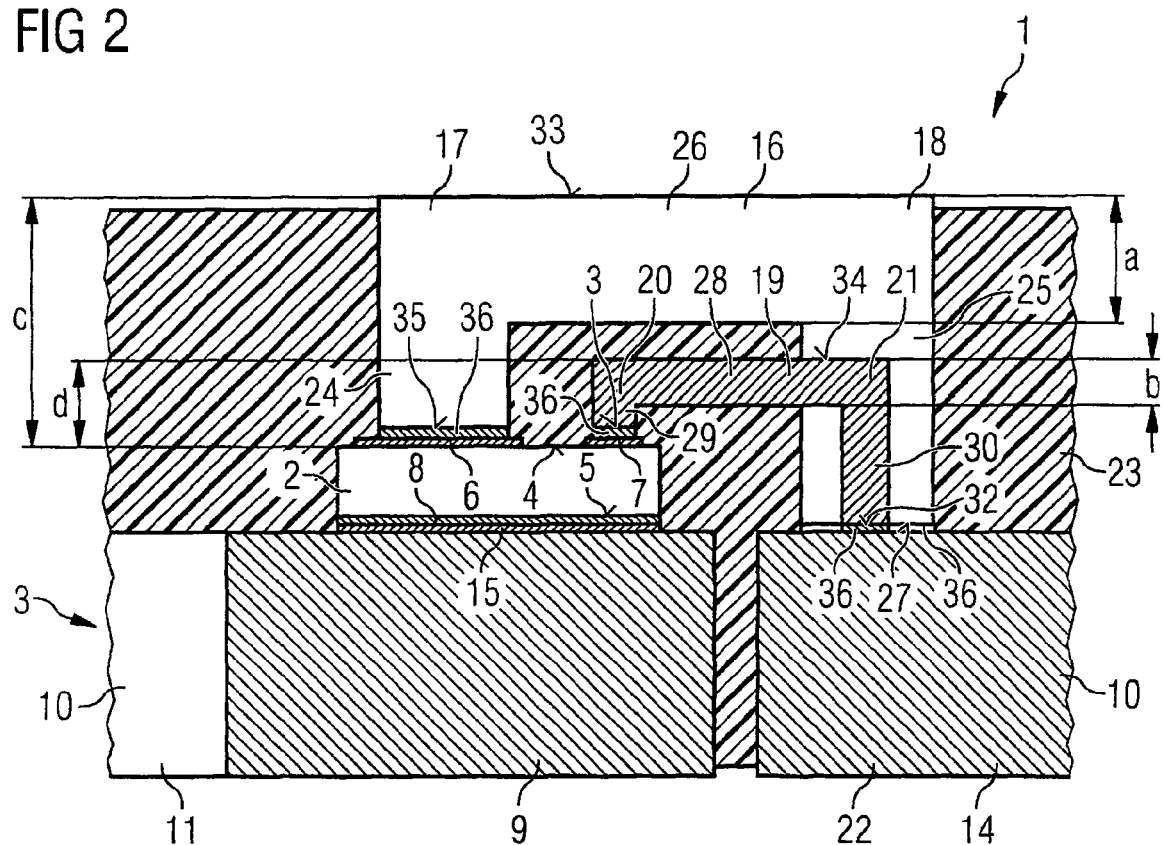
FIG. 2 shows a cross section A-A of the semiconductor device according to FIG. 1.

FIG. 2 shows a detail from a cross section A-A of the semiconductor device 1 from FIG. 1 which reveals the height arrangement of the source contact clip 16 and gate contact clip 19.

The rear side 5 of the semiconductor component 1 is mounted on the top side of the chip island 9 via a diffusion solder connection 15. The drain electrode 8 arranged on the rear side 5 of the semiconductor component 2 is electrically connected to the chip island 9 and the drain flat conductor 11.

The source contact clip 16 has a U-shaped longitudinal cross section. The first contact region 17 and the second contact region 18 of the source contact clip 16 in each case have the form of a leg 24, 25 projecting perpendicularly from the two opposite edges of a plate region 26. The undersides of the legs form the first contact area 35 and the second contact area 27 of the source contact clip 16, which are mounted on the source electrode 6 and, respectively, the source contact area 12 of the source flat conductors 13.

The gate contact clip 19 also has a plate 28 having two projecting legs 29, 30, which form the first contact region 20 and the second contact region 21 of the gate contact clip 19. The legs 29, 30 project perpendicularly from the underside of the plate 28. The underside of the first leg 29 provides the first contact area 31 of the gate contact clip 19 and the underside of the second leg provides the second contact area 32 of the gate contact clip 19.

The source contact clip 16 has a material thickness a, which is approximately identical in the plate region 26 and in the first leg 24 and in the second leg 25. The gate contact clip 19 has a material thickness b, which is approximately identical in the plate region 28 and in the first leg 29 and in the second leg 30. The material thickness a of the source contact clip 16 is greater than the material thickness b of the gate contact clip 19. The source contact clip 16 and the gate contact clip 19 comprise a copper foil.

The first contact region 17 of the source contact clip 16 has a height c, which is greater than the height d of the first contact region 20 of the gate contact clip 19.

According to an embodiment, the upper surface 33 of the plate region 26 of the source contact clip 16 is arranged in a plane which is further away from the surface 3 of the semiconductor component 2 than the entire upper surface 34 of the gate contact clip 19.

The upper surface 33 of the plate region 26 of the source contact clip 16 thus provides a cooling linking area. In other words the plate region 26 provides an area on which an additional cooling element, such as a heat sink, may be mounted.

The semiconductor device 1 furthermore has a plastic housing composition 23 encapsulating the semiconductor component 2, the gate contact clip 19 and the top sides of the chip island 9 and the flat conductors 10. The underside of the chip island 9 and the undersides of the flat conductors 10 remain free of the plastic housing composition 23 and form the external contact areas 35 of the semiconductor device 1. The upper surface 33 of the plate region 28 of the source contact clip 16 is free of the plastic housing composition 23. The edge sides of the legs 24, 25 are embedded in the plastic housing composition, however. The housing surface thus has a metallic region 33 surrounded by the plastic housing composition 23.

The gate contact clip 19 is embedded in the plastic housing composition 23 and is consequently electrically insulated by means of the plastic housing composition 23. An additional heat sink (not shown here) can be mounted onto the uncovered upper surface 33 of the source contact clip 16 without an additional electrical insulation between the heat sink and the gate contact clip 19. The mounting of a heat sink on the semiconductor device 1 on the part of the customer is thus simplified.

The semiconductor device 1 is produced by the following method. The rear side 4 of the semiconductor component 2 is mounted on the chip island by means of a diffusion solder. The first contact region 20 of the gate contact clip 19 is mounted onto the gate electrode 7 and the second contact region 21 of the gate contact clip 19 is mounted onto the gate flat conductor 14 by means of a diffusion solder 36 in order to electrically connect the gate electrode 7 to the gate flat conductor 14.

The first contact region 17 of the source contact clip 16 is mounted onto the source electrode 6 and the second contact region 18 of the source contact clip 16 is mounted on the source contact area 12 by means of a diffusion solder 36 in order to electrically connect the source electrode 6 to the source flat conductors 13. On account of the different material thicknesses a and b and the different lengths c and d of the legs of the source contact clip 16 and of the gate contact clip 19, the upper surface 33 of the plate region 26 of the source contact clip 16 is in a plane which is further away from the surface 3 of the semiconductor component 2 than the entire upper surface 34 of the gate contact clip 19.

The semiconductor component 2, the gate contact clip 19, the top side of the chip island 9 and of the flat conductors 10 and the edge sides of the source contact clip 16 are subsequently embedded into a plastic housing composition 23. The upper surface 33 of the plate region 26 of the source contact clip 16 is free of the plastic housing composition 23 and provides a cooling linking area for the semiconductor device 1.

The source contact clip 16 may be fabricated by stamping the desired lateral form of the source contact 16 clip from a metal foil or plate comprising a thickness a. The leg portions 24, 25 of the source contact clip 16 may be formed by plastically deforming the source contact clip 16. The U-form may be produced by bending the two opposing ends of the source contact clip 16. Alternatively, the leg portions 24, 25 may be formed by pressing the upper surface 33 of the source contact clip 16 so as to produce two depressed regions 24, 25.

Similarly, the gate contact clip 19 of the desired form may be fabricated by stamping the gate contact clip 19 from a metal foil or plate comprising a thickness b and plastically deforming it as in one of the embodiments described for the source contact clip 16.

The source contact clip 16 and the gate contact clip 19 may comprise a metal or an alloy such as copper.

LIST OF REFERENCE SYMBOLS

1 Semiconductor device
2 Semiconductor component
3 Flat conductor leadframe
4 Top side
5 Rear side
6 Source electrode
7 Gate electrode
8 Drain electrode
9 Chip island
10 Flat conductor
11 Drain flat conductor
12 Source contact area
13 Source flat conductor
14 Gate flat conductor
15 Diffusion solder
16 Source contact clip
17 First contact region of the source contact clip
18 Second contact region of the source contact clip
19 Gate contact clip
20 First contact region of the gate contact clip
21 Second contact region of the gate contact clip
22 Gate contact area
23 Plastic housing composition
24 First leg of the source contact clip
25 Second leg of the source contact clip
26 Plate region of the source contact clip
27 Second contact area of the source contact clip
28 Plate region of the gate contact clip
29 First leg of the gate contact clip
30 Second leg of the gate contact clip
31 First contact area of the gate contact clip
32 Second contact area of the gate contact clip
33 Cooling linking area
34 Upper surface of the gate contact clip
35 First contact area of the source contact clip
36 Diffusion solder

What is claimed is:

1. A semiconductor device comprising:
   a semiconductor component having a top side and a rear side, at least one first electrode and at least one control electrode being arranged on the top side and a second electrode being arranged on the rear side,
   a circuit carrier having a chip island and a plurality of flat conductors, the rear side of the semiconductor component being mounted on the chip island,
   at least one first contact clip having a first contact region and a second contact region, and the first electrode being electrically connected to a first flat conductor via the first contact clip, and
   at least one second contact clip having a first contact region and a second contact region, and the control electrode being electrically connected to a control flat conductor via the second contact clip,
   wherein an upper surface of the first contact clip is at least partly arranged in a plane which is further away from the top side of the semiconductor component than the entire upper surface of the second contact clip, and
   wherein the first contact region of the first contact clip is arranged on the first electrode and the first contact region of the second contact clip is arranged on the control electrode, a thickness a of the first contact region of the first contact clip, being greater than a thickness b of the first contact region of the second contact clip.

2. The semiconductor device according to claim 1, wherein the semiconductor device furthermore comprises a plastic housing composition, the upper surface of the first contact clip being at least partly free of the plastic housing composition, and the upper surface of the second contact clip being encapsulated by the plastic housing composition.

3. The semiconductor device according to claim 1, wherein the first contact region of the first contact clip is arranged on the first electrode and the first contact region of the second contact clip is arranged on the control electrode, a height c of the first contact region of the first contact clip being greater than a height d of the first contact region of the second contact clip.

4. A semiconductor device comprising:
   a semiconductor component having a top side and a rear side, at least one first electrode and at least one control electrode being arranged on the top side and a second electrode being arranged on the rear side,
   a circuit carrier having a chip island and a plurality of flat conductors, the rear side of the semiconductor component being mounted on the chip island,
   at least one first contact clip having a first contact region and a second contact region, and the first electrode being electrically connected to a first flat conductor via the first contact clip, and
   at least one second contact clip having a first contact region and a second contact region, and the control electrode being electrically connected to a control flat conductor via the second contact clip,
   wherein an upper surface of the first contact clip is at least partly arranged in a plane which is further away from the top side of the semiconductor component than the entire upper surface of the second contact clip, and
   wherein a thickness of the first contact region of the first contact clip and a thickness of the second contact region of the first contact clip are approximately identical, and a thickness of the first contact region of the second contact clip and a thickness of the second contact region of the second contact clip are approximately identical.

5. The semiconductor device according to claim 1, wherein the first contact clip comprises a first leg portion, a second leg portion and a plate portion extending between the first leg portion and the second leg portion, wherein the first leg portion provides the first contact region and the second leg portion provides the second contact portion.

6. The semiconductor device according to claim 5, wherein the first leg portion and the second leg portion comprise a thickness a.

7. The semiconductor device according to claim 5, wherein the first contact clip comprises a metal foil.

8. The semiconductor device according to claim 1, wherein the second contact clip comprises a first leg portion, a second leg portion and a plate portion extending between the first leg portion and the second leg portion, wherein the first leg portion provides the first contact region and the second leg portion provides the second contact portion, wherein the first leg portion and the second leg portion comprise a thickness b.

9. The semiconductor device according to claim 8, wherein the second contact clip comprises a metal foil.

10. The semiconductor device according to claim 1, wherein the semiconductor device furthermore comprises a plastic housing composition, and wherein a lower side of the chip island and lower sides of the flat conductors are free of the plastic housing composition.

11. The semiconductor device according to claim 1, wherein the first contact clip is electrically connected to at least one of the first electrode and the first flat conductor by means of soft solder, diffusion solder, or an electrically conductive adhesive.

12. The semiconductor device according to claim 1, wherein the second contact clip is electrically connected to at least one of the control electrode and the control flat conductor by means of soft solder, diffusion solder, or an electrically conductive adhesive.

13. The semiconductor device according to claim 1, wherein the semiconductor component is a vertical power semiconductor component.

14. The semiconductor device according to claim 13, wherein the vertical power semiconductor component is a MOSFET, an IGBT or a BJT.

15. The semiconductor device according to claim 13, wherein the vertical power semiconductor component is an n-channel MOSFET.

16. The semiconductor device according to claim 1, wherein the semiconductor device comprises a housing that is one of an SO8 housing, a TO252 housing, a PowerSO housing, a PowerQFN housing, a VQFN housing, a TO3 Housing, or a TO220 housing.

17. A semiconductor device, comprising:
a semiconductor component having a first side and a second side, a first electrode and a control electrode being arranged on the first side and a second electrode being arranged on the second side;
a circuit carrier having a chip island, a first flat conductor, and a second flat conductor, the second side of the semiconductor component being disposed on the chip island;
a first contact clip having a first contact region and a second contact region, the first electrode being electrically connected to the first flat conductor via the first contact clip; and
a second contact clip having a first contact region and a second contact region, the control electrode being electrically connected to the second flat conductor via the second contact clip,
wherein a surface of the first contact clip is at least partly arranged in a plane that is further away from the first side of the semiconductor component than an entire surface of the second contact clip, and
wherein the first contact region of the first contact clip is arranged on the first electrode and the first contact region of the second contact clip is arranged on the control electrode, a thickness of the first contact region of the first contact clip being greater than a thickness of the first contact region of the second contact clip.

18. The semiconductor device according to claim 17, wherein the semiconductor device further comprises a plastic housing composition, the surface of the first contact clip being at least partly free of the plastic housing composition, and the surface of the second contact clip being encapsulated by the plastic housing composition.

19. The semiconductor device according to claim 17, wherein the first contact region of the first contact clip is arranged on the first electrode and the first contact region of the second contact clip is arranged on the control electrode, a height of the first contact region of the first contact clip being greater than a height of the first contact region of the second contact clip.

20. The semiconductor device according to claim 17, wherein the first contact clip comprises a first leg portion, a second leg portion and a plate portion extending between the first leg portion and the second leg portion, wherein the first leg portion provides the first contact region and the second leg portion provides the second contact portion.

21. The semiconductor device according to claim 20, wherein the first leg portion and the second leg portion comprise a same thickness as a thickness of the first contact region of the second contact clip.

22. The semiconductor device according to claim 17, wherein the first contact clip comprises a metal foil.

23. The semiconductor device according to claim 17, wherein the first contact clip is electrically connected to at least one of the first electrode and the first flat conductor.

24. The semiconductor device according to claim 17, wherein the second contact clip is electrically connected to at least one of the control electrode and the control flat conductor.

25. The semiconductor device according to claim 17, wherein the semiconductor component is a vertical power semiconductor component.

* * * * *